(12) United States Patent
Kaneda et al.

(10) Patent No.: US 11,393,733 B2
(45) Date of Patent: Jul. 19, 2022

(54) SEMICONDUCTOR DEVICE

(71) Applicant: SUMITOMO ELECTRIC INDUSTRIES, LTD., Osaka (JP)

(72) Inventors: Tatsushi Kaneda, Osaka (JP); Yoshisumi Kawabata, Osaka (JP); So Tanaka, Osaka (JP); Hirotaka Oomori, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/971,089

(22) PCT Filed: Jan. 15, 2019

(86) PCT No.: PCT/JP2019/000931
§ 371 (c)(1),
(2) Date: Aug. 19, 2020

(87) PCT Pub. No.: WO2019/176260
PCT Pub. Date: Sep. 19, 2019

(65) Prior Publication Data
US 2020/0395255 A1     Dec. 17, 2020

(30) Foreign Application Priority Data

Mar. 13, 2018   (JP) .............................. JP2018-044936

(51) Int. Cl.
*H01L 23/13*     (2006.01)
*H01L 23/049*    (2006.01)
(Continued)

(52) U.S. Cl.
CPC ........ *H01L 23/049* (2013.01); *H01L 23/3121* (2013.01); *H01L 23/3735* (2013.01);
(Continued)

(58) Field of Classification Search
CPC .... H01L 23/049; H01L 23/13; H01L 23/3735
See application file for complete search history.

(56) References Cited

U.S. PATENT DOCUMENTS

| 5,041,901 A * | 8/1991 | Kitano | ................. H05K 3/3426 257/779 |
| 2014/0332951 A1* | 11/2014 | Nakamura | ............ H01L 23/562 257/712 |

(Continued)

FOREIGN PATENT DOCUMENTS

| JP | 2005-353945 | 12/2005 |
| JP | 2016-195224 | 11/2016 |

*Primary Examiner* — Michele Fan
(74) *Attorney, Agent, or Firm* — IPUSA, PLLC

(57) ABSTRACT

A semiconductor device includes: a base plate having a first surface and having a first contact area in the first surface; a metal plate having a second surface, disposed such that the second surface faces the first surface, and having a second contact area in the second surface; a bonding material disposed between the first surface and the second surface and in contact with the first contact area and the second contact area to bond the metal plate and the base plate; an insulating plate disposed on the metal plate; a circuit member disposed on the insulating plate; a semiconductor element mounted to the circuit member; and a sealing material that covers the metal plate, the bonding material, the insulating plate, the circuit member, and the semiconductor element to seal a space above the base plate, wherein outside the second contact area, the second surface has a non-contact area that is not in contact with the bonding material, wherein on the base plate, a groove portion facing the non-contact area and surrounding the first contact area is provided, and wherein, in a plan view as viewed in a thickness direction of the base plate, an inner periphery of a corner portion of the groove portion has a first curve.

5 Claims, 6 Drawing Sheets

(51) Int. Cl.
  *H01L 23/31* (2006.01)
  *H01L 23/373* (2006.01)
  *H01L 23/00* (2006.01)

(52) U.S. Cl.
  CPC ............ *H01L 23/562* (2013.01); *H01L 24/32* (2013.01); *H01L 24/48* (2013.01); *H01L 24/73* (2013.01); *H01L 2224/32225* (2013.01); *H01L 2224/48225* (2013.01); *H01L 2224/73265* (2013.01); *H01L 2924/15787* (2013.01); *H01L 2924/3512* (2013.01)

(56) References Cited

U.S. PATENT DOCUMENTS

2016/0111377 A1* 4/2016 Olleres ................ H01L 23/562
                                                                  257/703
2016/0322274 A1* 11/2016 Takizawa ................ H01L 23/12
2017/0271274 A1* 9/2017 Hinata ................ H01L 23/562

* cited by examiner

US 11,393,733 B2

SEMICONDUCTOR DEVICE

TECHNICAL FIELD

The present disclosure relates to a semiconductor device.

The present application is based on and claims priority to Japanese Patent Application No. 2018-044936, filed on Mar. 13, 2018, the entire contents of the Japanese Patent Application are hereby incorporated herein by reference.

BACKGROUND ART

A semiconductor device in which a layered substrate having a circuit board to which a semiconductor chip is fixed is sealed with a hard resin is known (see, for example, Patent Document 1).

Prior Art Document

Patent Document

[Patent Document 1] Japanese Laid-open Patent Publication No. 2016-195224

SUMMARY OF THE INVENTION

According to the present disclosure, a semiconductor device includes: a base plate having a first surface and having a first contact area in the first surface; a metal plate having a second surface, disposed such that the second surface faces the first surface, and having a second contact area in the second surface; a bonding material disposed between the first surface and the second surface and in contact with the first contact area and the second contact area to bond the metal plate and the base plate; an insulating plate disposed on the metal plate; a circuit member disposed on the insulating plate; a semiconductor element mounted to the circuit member; and a sealing material that covers the metal plate, the bonding material, the insulating plate, the circuit member, and the semiconductor element to seal a space above the base plate. Outside the second contact area, the second surface has a non-contact area that is not in contact with the bonding material, and on the base plate, a groove portion facing the non-contact area and surrounding the first contact area is provided. In a plan view as viewed in a thickness direction of the base plate, an inner periphery of a corner portion of the groove portion has a first curve.

EMBODIMENT FOR CARRYING OUT THE INVENTION

Figure 1:
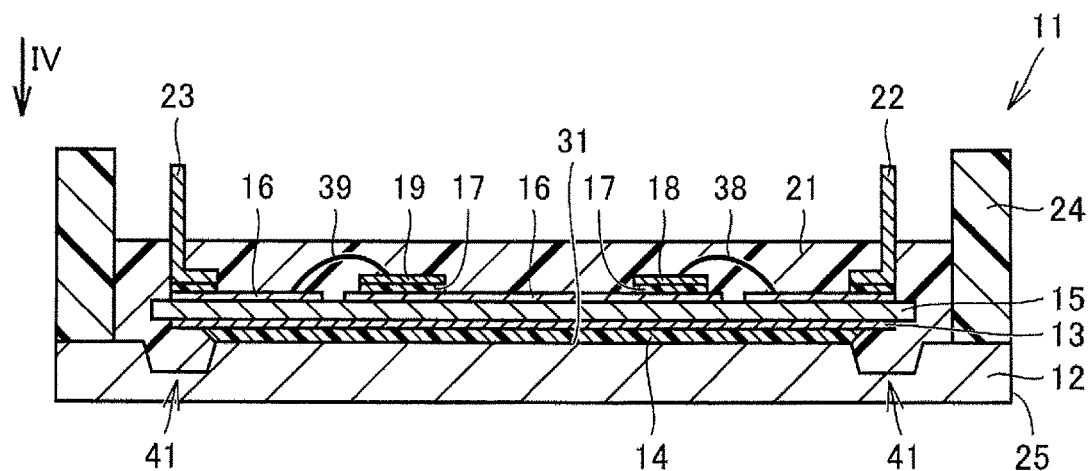
FIG. 1 is a schematic cross-sectional view illustrating a configuration of a semiconductor device according to an embodiment of the present disclosure.

Patent Document 1 discloses a semiconductor device that includes a base plate that is bonded to the bottom surface of a metal plate and having a recessed portion in at least a part of a surface bonded to the metal plate facing an end of the metal plate; and a sealing material made of a hard resin and in contact with a semiconductor chip, an insulating plate, a circuit plate, a side surface of the metal plate and the bottom surface of the metal plate facing the recessed portion. The metal plate and the insulation plate are bonded by, for example, a bonding material using lead-free tin-based solder. The groove portion as a recessed portion filled with the sealing material causes an anchoring effect.

In the semiconductor device disclosed in Patent Document 1, a recessed portion is also formed in an area of the base plate facing a corner portion of the metal plate. Also at the inner periphery of the base plate defining the concave portion, a corner portion is provided in accordance with the shape of the metal plate. However, in such a state, there is a possibility that the reliability of the semiconductor device may be decreased due to interfacial separation between the bonding material and the sealing material, cracking of the sealing material, or the like.

Therefore, one object of the present disclosure is to provide a semiconductor device that is highly reliable.

DESCRIPTION OF EMBODIMENTS OF THE PRESENT DISCLOSURE

First, embodiments of the present disclosure will be listed and described. According to the present disclosure, a semiconductor device includes: a base plate having a first contact area; a metal plate having a second contact area; a bonding material disposed between the base plate and the metal plate and in contact with the first contact area and the second contact area to bond the metal plate and the base plate; an insulating plate disposed on the metal plate; a circuit member disposed on the insulating plate and in contact with the insulating plate; a semiconductor element mounted to the circuit member; and a sealing material that covers the metal plate, the bonding material, the insulating plate, the circuit member, and the semiconductor element to seal a space above the base plate. Outside the second contact area, the second surface of the metal plate has a non-contact area that is not in contact with the bonding material. On the base plate, a groove portion facing the non-contact area and surrounding the first contact area is provided. In a plan view as viewed in a thickness direction of the base plate, an inner periphery of a corner portion of the groove portion has a first curve.

For example, solder as the bonding material wets and spreads at the time of bonding the metal plate and the base plate. The wetting and spreading of the bonding material at the corner portion of the inner periphery of the wall surface defining the groove portion differs from the wetting and spreading of the bonding material at an edge portion of the inner periphery of the base plate extending in one direction. At the edge portion of the bonding material in contact with the corner portion of the inner periphery of the base plate, there is a possibility that a portion where the shrinkage stress of the sealing material is concentrated occurs. In order to further enhance the reliability of a semiconductor device, it is desired to reduce the possibility that a portion where the shrinkage stress is concentrated occurs and to suppress interfacial separation between the bonding material and the sealing material and an occurrence of a crack in the sealing material.

According to the semiconductor device of the present disclosure, in the plan view as viewed in the thickness direction of the base plate, the inner periphery of the corner portion of the groove portion has a first curve. In this manner, it is possible to reduce the possibility that a portion where the shrinkage stress of the sealing material is concentrated occurs. Therefore, while suppressing interface separation between the bonding material and the sealing material and an occurrence of a crack of the sealing material, it is possible to obtain a semiconductor device that is highly reliable.

In the semiconductor device, in the plan view as viewed in the thickness direction of the base plate, an outer periphery of a corner portion of the metal plate has a second curve. The first curve has an arc shape that is a convex shape toward outside, the second curve has an arc that is a convex shape toward outside, and a radius of curvature of the first curve is greater than a radius of curvature of the second curve. In this manner, at the outer peripheral area of the corner portion of the groove portion, it is possible to reduce the possibility that the distance between the inner periphery of the corner portion of the groove portion and the outer periphery of the metal plate is shortened. Accordingly, at the outer peripheral area of the corner portion of the groove portion, the stress concentration can be reduced, and the semiconductor device can be more reliable.

Also, according to the present disclosure, a semiconductor device includes: a base plate having a first contact area; a metal plate having a second contact area; a bonding material disposed between the base plate and the metal plate and in contact with the first contact area and the second contact area to bond the metal plate and the base plate; an insulating plate disposed on the metal plate; a circuit member disposed on the insulating plate and in contact with the insulating plate; a semiconductor element mounted to the circuit member; and a sealing material that covers the metal plate, the bonding material, the insulating plate, the circuit member, and the semiconductor element to seal a space above the base plate. Outside the second contact area, the second surface of the metal plate has a non-contact area that is not in contact with the bonding material. On the base plate, a groove portion facing the non-contact area and surrounding the first contact area is provided. In a plan view as viewed in a thickness direction of the base plate, an inner periphery of a corner portion of the groove portion has a straight line and a plurality of curves that are connected to respective ends of the straight line.

According to such a semiconductor device, it is also possible to reduce the possibility that a portion where the shrinkage stress of the sealing material is concentrated occurs. Therefore, while suppressing interface separation between the bonding material and the sealing material and an occurrence of a crack of the sealing material, it is possible to obtain a semiconductor device that is highly reliable.

In the semiconductor device, in the plan view as viewed in the thickness direction of the base plate, the inner periphery of the groove portion may have a first straight line that is connected to one end of the corner portion and a second straight line that is connected to the other end of the corner portion, and the corner portion may be located inside an area that is defined by extending the first straight line and the second straight line. In this manner, it is possible to reduce the possibility that a portion where the shrinkage stress of the sealing material is concentrated occurs. Therefore, while suppressing an occurrence of a crack at the sealing material, it is possible to obtain a semiconductor device that is highly reliable.

In the semiconductor device, in the plan view as viewed in the thickness direction of the base plate, the non-contact area may include an outer peripheral area of the corner portion of the groove portion. In this manner, at the outer peripheral area of the corner portion of the groove portion, a step portion between the metal plate and the insulating plate and a step portion between the metal plate and the bonding material can be made for a portion where stress is concentrated. As a result, it is possible to reduce the stress concentration. Therefore, while suppressing an occurrence of a crack at the sealing material, it is possible to obtain a semiconductor device that is highly reliable.

The semiconductor device may further include a coating layer, having a lower wettability than that of the metal plate, formed on the non-contact area. In this manner, the wetting and spreading of the bonding material to the area where the coating layer is formed and the area outside the coating layer can be suppressed. Therefore, a step portion between the metal plate and the insulating plate and a step portion between the metal plate and the bonding material can be made more reliably for a portion where stress is concentrated, and the stress concentration can be dispersed. As a result, while preventing an occurrence of a crack at the sealing material, it is possible to obtain a semiconductor device that is highly reliable.

Details of Embodiments of the Present Disclosure

A semiconductor device according to an embodiment of the present disclosure will be described with reference to the accompanying drawings. It should be noted that in the following description, the same or corresponding elements are referred to by the same reference numerals, and a duplicate description thereof will not be repeated.

First Embodiment

Figure 2:
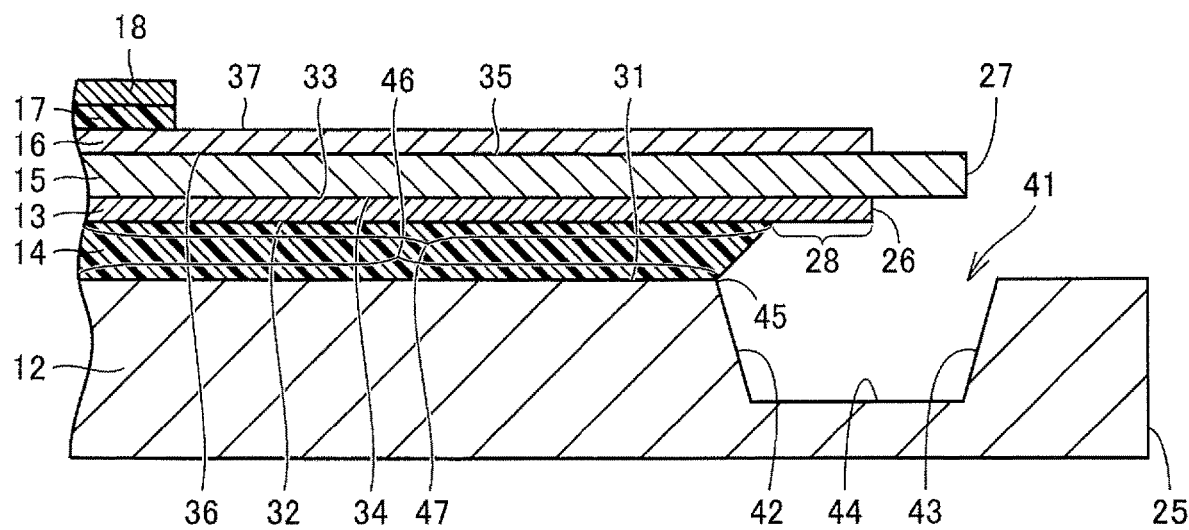
FIG. 2 is a cross-sectional view illustrating an enlarged view of a part of the semiconductor device illustrated in FIG. 1.
Figure 3:
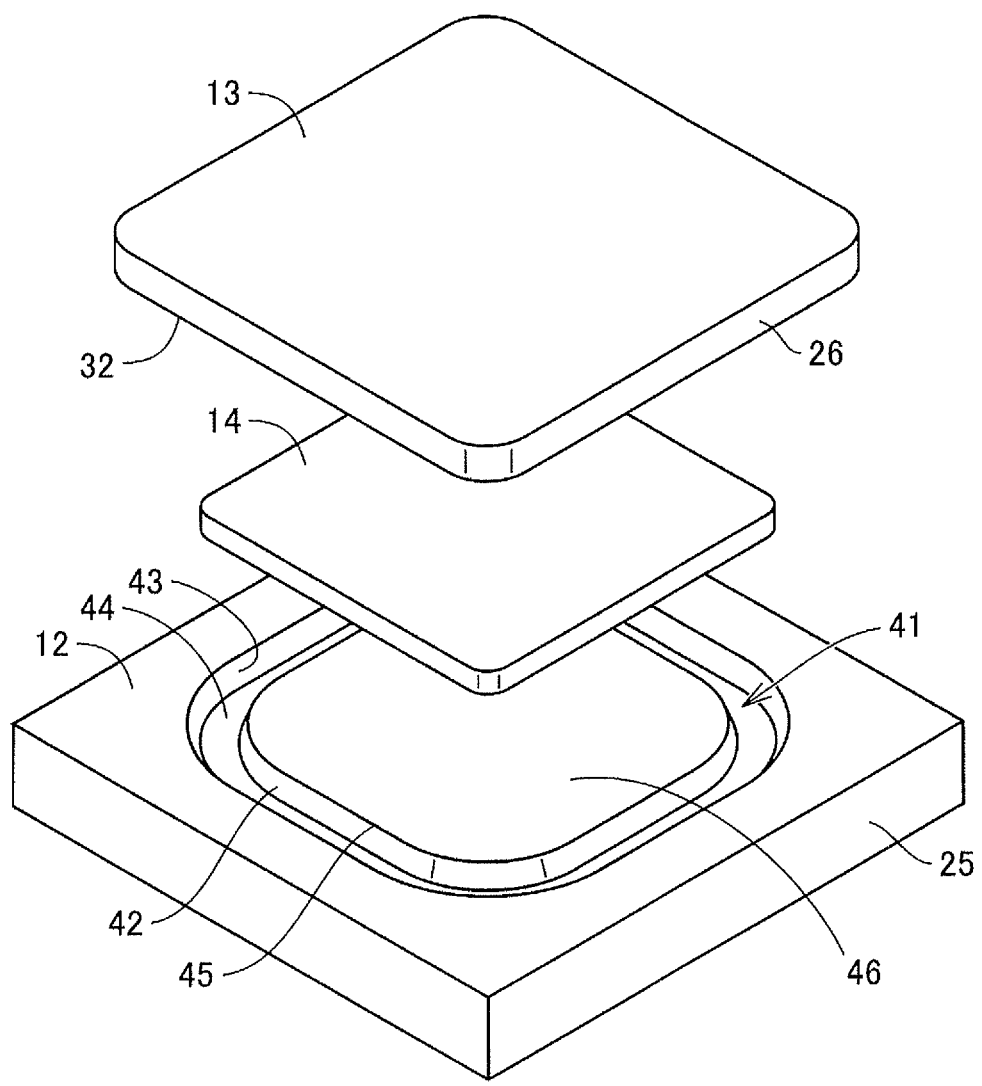
FIG. 3 is an exploded perspective view illustrating a part of members constituting the semiconductor device illustrated in FIG. 1.
Figure 4:
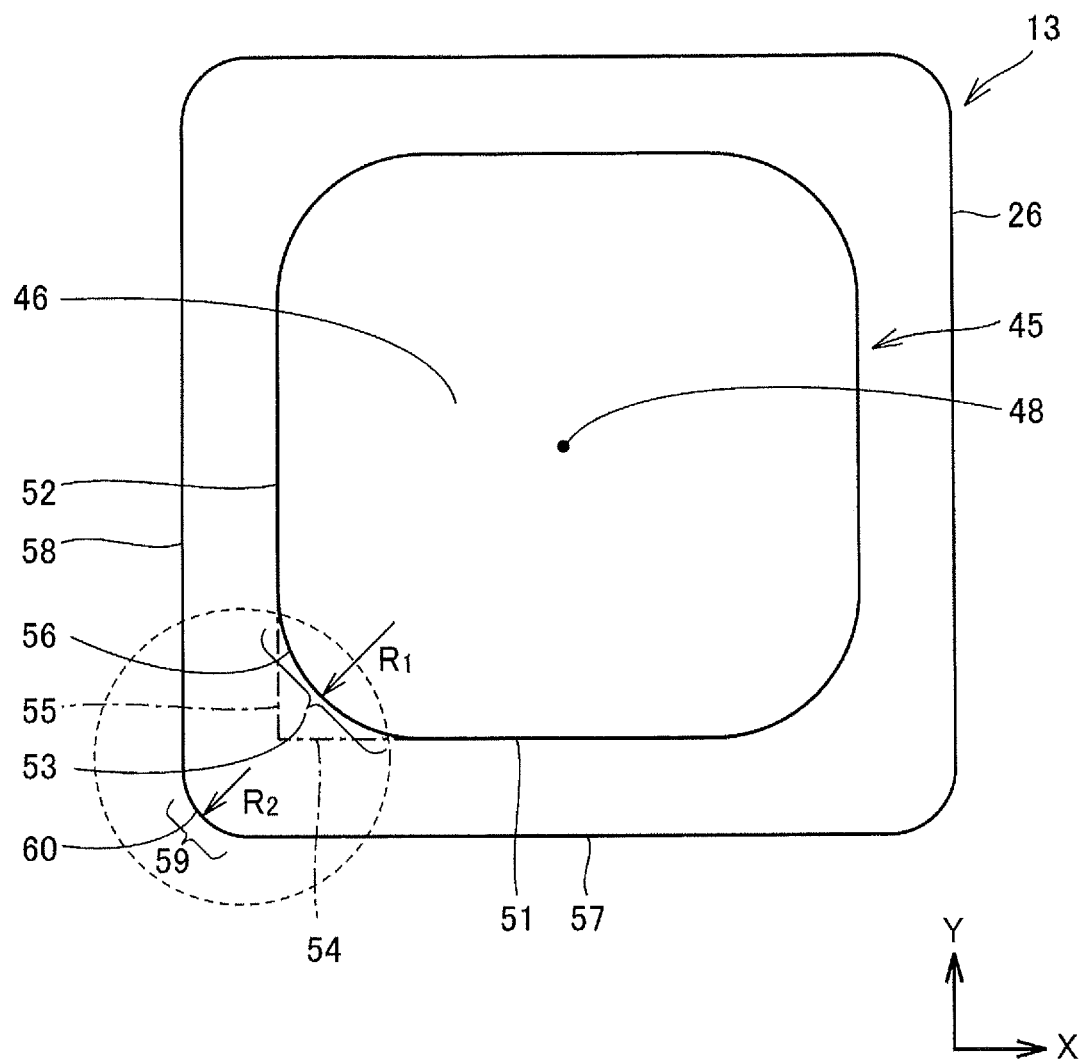
FIG. 4 is a diagram illustrating a plan view of a part of members constituting the semiconductor device illustrated in FIG. 1 as viewed in the thickness direction of a base plate.

FIG. 1 is a schematic cross-sectional view illustrating a configuration of a semiconductor device according to an embodiment of the present disclosure. FIG. 2 is a cross-sectional view illustrating an enlarged view of a part of the semiconductor device illustrated in FIG. 1. FIG. 2 illustrates a state in which the sealing material and the like are removed in the semiconductor device illustrated in FIG. 1. FIG. 1 and FIG. 2 correspond to a cross-section of the semiconductor device cut along the thickness direction of the base plate. FIG. 3 is an exploded perspective view illustrating a part of members constituting the semiconductor device illustrated in FIG. 1. FIG. 4 is a diagram illustrating a plan view of a part of members constituting the semiconductor device illustrated in FIG. 1 as viewed in the thickness direction of a base plate. FIG. 4 corresponds to a case viewed from the direction indicated by the arrow IV illustrated in FIG. 1. Also, for ease of understanding, in FIG. 4, the inner periphery of the wall surface of the base plate overlapping the metal plate in plan view is illustrated.

Referring to FIG. 1 through FIG. 4, a semiconductor device 11 according to one embodiment of the present disclosure includes a base plate 12, a metal plate 13, bonding materials 14 and 17, an insulating plate 15, a circuit member 16, semiconductor elements 18 and 19, a sealing material 21, terminals 22 and 23, and an outer frame 24. The metal plate 13, the insulating plate 15, and the circuit member 16 are stacked in the order of the metal plate 13, the insulating plate 15, and the circuit member 16 from the bottom.

The outer shape of the base plate 12, which is as a base of the semiconductor device 11, is a rectangular shape. The base plate 12 has a first surface 31 that is located on one side in the thickness direction of the base plate 12. The base plate 12 has a first contact area 46 in the first surface 31 in contact with the bonding material 14 (see in particular FIG. 2). Components such as the metal plate 13, the insulating plate 15, and the circuit member 16 are disposed on the first surface 31. Examples selected as the material of the base plate 12 include a material having high thermal conductivity, specifically a metal material such as copper or aluminum, and a composite material of metal and ceramic. It should be noted that in the semiconductor device 11 illustrated in FIG. 1, the metal plate 13 is disposed above the first surface 31. However, in a case in which the semiconductor device 11 is arranged upside down, the respective members are arranged in reverse order. That is, in a case in which the semiconductor device 11 is arranged upside down, "the metal plate 13 is disposed above the first surface 31" means that "the metal plate 13 is disposed below the first surface 31". In a case in which the semiconductor device 11 is arranged laterally or in an inclined manner, the respective components are also arranged laterally or in an inclined manner. Also, the structure of the base plate 12 will be described in detail below.

The metal plate 13 is disposed above the first surface 31. The outer shape of the metal plate 13 is also a rectangular shape. An outer periphery 26 of the metal plate 13 is located inward relative to an outer periphery 25 of the base plate 12 in a plan view as viewed in the thickness direction of the base plate 12. The metal plate 13 has a second surface 32 facing the first surface 31 of the base plate 12, and has a surface 33 located on the side opposite to the second surface 32 in the thickness direction of the base plate 12. The metal plate 13 has a second contact area 47 that is in contact with the bonding material 14 in the second surface 32. The second surface of the metal plate 13 has an exposed area 28 that is disposed outside the second contact area 47 and that is exposed from the bonding material 14. Here, exposure means that, the second surface 32 is not covered by the bonding material 14. In other words, the exposed area 28 is a non-contact area that is located outside the second contact area 47 and that is not in contact with the bonding material 14. The metal plate 13 is formed of, for example, a thin metal material that is electrically conductive. Specifically, copper foil is used as the metal plate 13. The metal plate 13 is bonded to the base plate 12 by the bonding material 14. The configuration of the metal plate 13 will be described in detail below.

The bonding material 14 joins the metal plate 13 with the base plate 12. The bonding material 14 is disposed in contact with the first contact area 46 and the second contact area 47. That is, the bonding material 14 is provided to be interposed between the base plate 12 and the metal plate 13. For example, solder may be employed as the bonding material 14. A plating process may be applied to the first contact area 46 so as to increase the wettability with the bonding material 14. It should be noted that wettability may be evaluated by a method such as the wetting spread test or the meniscograph test, for example.

The insulating plate 15 is disposed in contact with the surface 33. The outer shape of the insulating plate 15 is also a rectangular shape. An outer periphery 27 of the insulating plate 15 is located inward relative to the outer periphery 25 of the base plate 12, and also located outward relative to the outer periphery 26 of the metal plate 13 in the plan view as viewed in the thickness direction of the base plate 12. The insulating plate 15 has a surface 34 facing the surface 33 of the metal plate 13, and has a surface 35 located on the side opposite to the surface 34 in the thickness direction of the base plate 12. The insulating plate 15 is made of a ceramic material having an insulating property, for example. Specific examples of such a material include aluminum oxide, aluminum nitride, silicon nitride, and the like. It should be noted that the thickness direction of the base plate 12 is the same as the thickness direction of the insulating plate 15 in this case.

The circuit member 16 is disposed on and in contact with the surface 35. A circuit pattern is formed on the circuit member 16. The circuit member 16 has a surface 36 facing the surface 35, and has a surface 37 located on the side opposite to the surface 36 in the thickness direction of the base plate 12. Similar to the metal plate 13, the circuit member 16 is formed of a thin metal material that is electrically conductive, for example.

The semiconductor elements 18 and 19 are mounted on the surface 37 via the bonding material 17. That is, the semiconductor elements 18 and 19 are bonded and fixed to the surface 37 by the bonding material 17. The semiconductor elements 18 and 19 are electrically connected to respective areas of the circuit member 16 via bonding wires 38 and 39. The respective areas differ from areas where the semiconductor elements 18 and 19 are mounted. It should be noted that although the two semiconductor elements 18 and 19 are mounted in the present embodiment, the number and arrangement of semiconductor elements may be appropriately determined in accordance with the configuration of the semiconductor device 11.

The terminals 22 and 23 are electrically connected and fixed to the respective areas of the circuit member 16 where the semiconductor elements 16 and 19 are not mounted. The terminals 22 and 23 have a shape obtained by bending a member made of metal, for example. One end of each of the terminals 22 and 23, which is not connected to the circuit member 16, is exposed without being covered by the sealing material 21.

The sealing material 21 covers the metal plate 13, the bonding materials 14 and 17, the insulating plate 15, the circuit member 16, and the semiconductor elements 18 and 19 to seal a space above the first surface 31. For example, a resin having high insulation properties and high heat resistance is used as the sealing material 21. Specifically, a thermosetting resin such as an epoxy resin or a phenolic resin is used. It should be noted that, for example, a filler may be added to the sealing material 21 to enhance insulation properties, as necessary.

The outer frame 24 is attached to the first surface 31 along the outer periphery 25 of the base plate 12. The sealing material 21 is formed by pouring an uncured epoxy resin or the like into the space surrounded by the outer frame 24, and curing the epoxy resin.

Next, specific shapes of the base plate 12 and the metal plate 13 will be described. A groove portion 41 is formed on the first surface 31 of the base plate 12. The groove portion 41 is disposed to face the exposed area 28 and to surround the first contact area 46 in the plan view as viewed in the thickness direction of the base plate 12, and is continuously provided in a loop shape. The base plate 12 may have any width that allows the liquid sealing material 21 to flow into the base plate 12.

The groove portion 41 is defined by an inner wall surface 42, an outer wall surface 43 and a bottom wall surface 44. At the first surface 31, the area adjacent to the groove portion 41 and the inner wall surface 42 are connected at an obtuse angle. At the first surface 31, the area adjacent to the groove portion 41 and the outer wall surface 43 are connected at an obtuse angle. The bottom wall surface 44 extends in a direction along the first surface 31. In a cross-section perpendicular to the extending direction of the groove portion 41, the groove portion 41 is shaped such that the width increases in accordance with proximity to the opening. The inner periphery 45 of the inner wall surface 42 corresponds to the outer periphery of the first contact area 46.

The inner periphery 45 of the inner wall surface 42 has a first inner peripheral area 51 extending in a first direction, a second inner peripheral area 52 extending in a second direction different from the first direction, and an inner peripheral connection portion 53 connecting the first inner peripheral area 51 and second inner peripheral area 52. The first direction is the X-axis direction. The second direction is the Y-axis direction. That is, in the present embodiment, the first direction is orthogonal to the second direction.

The inner peripheral connection portion 53 is disposed on the center 48 side of the base plate 12 with respect to a first extension line 54 extending the first inner peripheral area 51 in the first direction and a second extension line 55 extending the second inner peripheral area 52 in the second direction in the plan view as viewed in the thickness direction of the base plate 12. In other words, in the plan view as viewed in the thickness direction of the base plate 12, the inner periphery of the corner portion of the groove portion 41 may have a first straight line that is connected to one end of the corner portion and a second straight line that is connected to the other end of the corner portion, and the corner portion may be located inside the area defined by extending the first straight line and the second straight line. In FIG. 4, the first extension line 54 and the second extension line 55 are indicated by dash-dot lines. According to the present embodiment, the inner peripheral connection portion 53 is comprised of a curve. According to the present embodiment, the inner peripheral connection portion 53 is composed of a first curve 56 having an arc shape that is a convex shape toward the outside. In other words, in the plan view as viewed in the thickness direction of the base plate 12, the inner periphery of the corner portion of the groove portion 41 has the first curve 56.

According to the present embodiment, in the plan view as viewed in the thickness direction of the base plate 12, the inner periphery of the groove portion 41 is defined by a first two opposite sides, a second two opposite sides, and four corner portions that are connected to the first two opposite sides and the second two opposite sides. Also, in the plan view as viewed in the thickness direction of the base plate 12, the four corner portions are located inside the rectangle that is defined by extending the first two opposite sides and the second two opposite sides.

The configuration of the metal plate 13 will be described. The outer periphery 26 of the metal plate 13 has a first outer peripheral area 57 extending in a first direction and a second outer peripheral area 58 that is connected to the first outer peripheral area 57 at the outer peripheral connection portion 59 and extending in a second direction. The outer peripheral connection portion 59 is composed of a second curve 60 having an arc shape that is a convex shape toward the outside. In other words, in the plan view as viewed in the thickness direction of the base plate 12, the outer periphery of the corner portion of the metal plate 13 has a second curve 60.

The radius R1 of curvature of the first curve 56 is greater than the radius R2 of curvature of the second curve 60. That is, the curvature of the first curve 56 is smaller than that of the second curve 60.

According to the semiconductor device 11 as described above, because the inner peripheral connection portion 53 is composed of the first curve 56, it is possible to reduce the possibility that a portion where the shrinkage stress of the sealing material 21 is concentrated occurs. Therefore, while suppressing interface separation between the bonding material 14 and the sealing material 21 and an occurrence of a crack of the sealing material 21, it is possible to obtain the semiconductor device 11 that is highly reliable.

According to the present embodiment, because the inner peripheral connection portion 53 is disposed on the center 48 side of the base plate 12 with respect to the first extension line 54 extending the first inner peripheral area 51 in the first direction and the second extension line 55 extending the second inner peripheral area 52 in the second direction in the plan view as viewed in the thickness direction of the base plate 12, it is possible to reduce more properly the possibility that a portion where the shrinkage stress of the sealing material 21 is concentrated occurs. Therefore, while suppressing interface separation between the bonding material 14 and the sealing material 21 and an occurrence of a crack of the sealing material 21, it is possible to obtain the semiconductor device 11 that is highly reliable.

According to the present embodiment, because the exposed area 28 includes an outer peripheral area of the inner peripheral connection portion 53 in the plan view as viewed in the thickness direction of the base plate 12, at the outer peripheral area of the inner peripheral connection portion 53, a step portion between the metal plate 13 and the insulating plate 15 and a step portion between the metal plate 13 and the bonding material 14 can be made for a portion where stress is concentrated, and the stress concentration can be reduced. Therefore, while suppressing interface separation between the bonding material 14 and the sealing material 21 and an occurrence of a crack of the sealing material 21, it is possible to obtain the semiconductor device 11 that is highly reliable.

According to the present embodiment, because the radius R1 of curvature of the first curve 56 is greater than the radius R2 of curvature of the second curve 60, at the outer peripheral area of the inner peripheral connection portion 53, it is possible to reduce the possibility that the distance between the inner peripheral connection portion 53 and the outer periphery 26 of the metal plate 13 is shortened. Accordingly, at the outer peripheral area of the inner peripheral connection portion 53, the stress concentration can be reduced, and the semiconductor device 11 can be more reliable.

Second Embodiment

Figure 5:
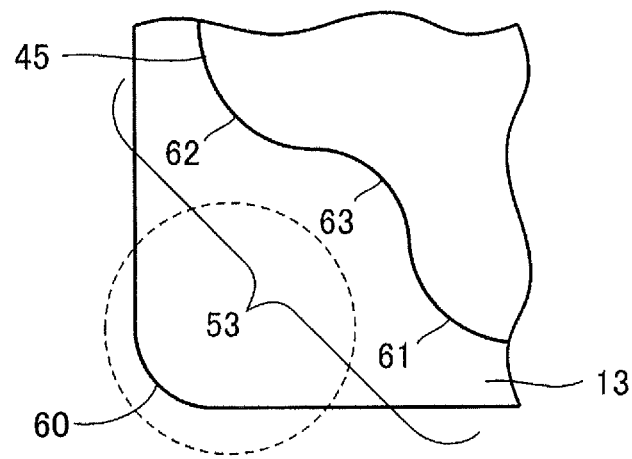
FIG. 5 is a diagram illustrating a part of a metal plate and a base plate that are included in a semiconductor device according to another embodiment of the present disclosure.

Although the case has been described in which the inner peripheral connection portion 53 is composed of a single first curve having an arc shape that is a convex shape toward the outside in the first embodiment, the inner peripheral connection portion 53 may be composed of a plurality of curves. FIG. 5 is a diagram illustrating a part of a metal plate 13 and a base plate 12 that are included in a semiconductor device 11 according to the second embodiment, which is another embodiment of the present disclosure. FIG. 5 is a diagram corresponding to the area inside the circle illustrated by the broken line in FIG. 4. With reference to FIG. 5, the inner peripheral connection portion 53 of the base plate 12 is composed of a plurality of curves. Specifically, the inner peripheral connection portion 53 includes two curves 61 and 62 each having an arch shape that is a convex shape toward the outside and a curve 63 having an arc shape that is a convex shape toward the center. In other words, in the plan view as viewed in the thickness direction of the base plate 12, the inner periphery of the corner portion of the groove portion 41 has a plurality of curves 61, 62, and 63. It should be noted that although FIG. 5 illustrates one of the four corner portions of the groove portion 41, the other corner portions may have a similar configuration. The curve 61 is connected to the first inner peripheral area and the curve 63. The curve 62 is connected to the second inner peripheral area and the curve 63. The curve 63 is connected to the respective curves 61 and 62. In the semiconductor device according to the second embodiment, the possibility that the distance between the inner peripheral connection portion 53 and the outer periphery of the metal plate 13 is shortened can be reduced particularly at the outer peripheral area of the inner peripheral connection portion 53 illustrated by the broken line in FIG. 5. In this manner, while suppressing interface separation between the bonding material 14 and the sealing material 21 and an occurrence of a crack of the sealing material 21, it is also possible to obtain the semiconductor device 11 that is highly reliable.

Third Embodiment

Figure 6:
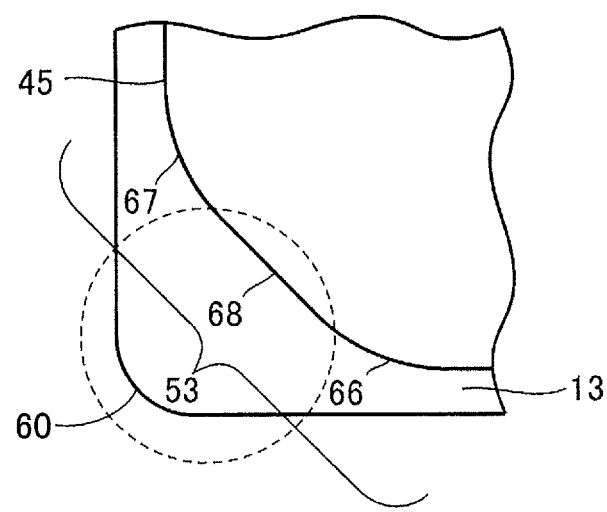
FIG. 6 is a diagram illustrating a part of a metal plate and a base plate that are included in a semiconductor device according to another embodiment of the present disclosure.

Although the case has been described in which the inner peripheral connection portion 53 is composed of only curve(s) in the first embodiment and the second embodiment, the inner peripheral connection portion 53 may be composed of a straight line and a plurality of curves that are respectively connected to both ends of the straight line in the plan view as viewed in the thickness direction of the base plate 12. FIG. 6 is a diagram illustrating a part of a metal plate 13 and a base plate 12 that are included in a semiconductor device 11 according to the third embodiment, which is another embodiment of the present disclosure. FIG. 6 is a diagram corresponding to the area inside the circle illustrated by the broken line in FIG. 4. With reference to FIG. 6, in the plan view as viewed in the thickness direction of the base plate 12, the inner peripheral connection portion 53 of the base plate 12 is composed of a straight line and a plurality of curves that are respectively connected to both ends of the straight line. Specifically, the inner peripheral connection portion 53 includes two curves 66 and 67 each having an arc shape that is a convex shape toward the outside and a straight line 68 inclinedly extending in both the first direction and the second direction. In other words, in the plan view as viewed in the thickness direction of the base plate 12, the inner periphery of the corner portion of the groove portion 41 has a straight line 68 and a plurality of curves 66 and 67 that are connected to the respective ends of the straight line. It should be noted that although FIG. 6 illustrates one of the four corner portions of the groove portion 41, the other corner portions may have a similar configuration. The curve 66 is connected to the first inner peripheral area 51 and the straight line 68. The curve 67 is connected to the second inner peripheral area 52 and the straight line 68. The respective ends of the straight line 68 are connected to the curves 66 and 67. In the semiconductor device according to the third embodiment, the possibility that the distance between the inner peripheral connection portion 53 and the outer periphery of the metal plate 13 is shortened can be reduced particularly at the outer peripheral area of the inner peripheral connection portion 53 illustrated by the broken line in FIG. 6. In this manner, while suppressing interface separation between the bonding material 14 and the sealing material 21 and an occurrence of a crack of the sealing material 21, it is also possible to obtain the semiconductor device 11 that is highly reliable.

Fourth Embodiment

Figure 7:
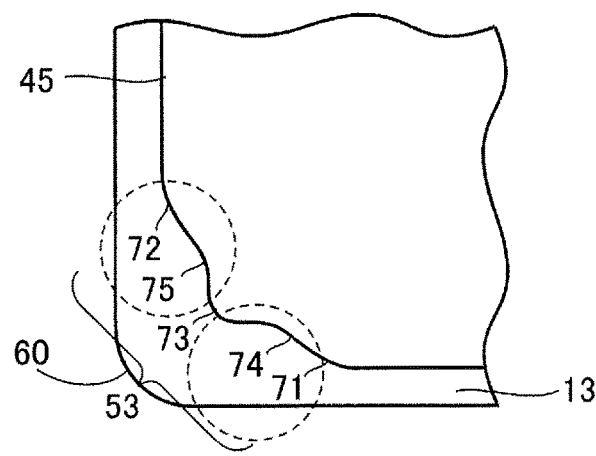
FIG. 7 is a diagram illustrating a part of a metal plate and a base plate that are included in a semiconductor device according to another embodiment of the present disclosure.

The inner peripheral connection portion 53 may include more curves and straight lines. FIG. 7 is a diagram illustrating a part of a metal plate 13 and a base plate 12 that are included in a semiconductor device 11 according to the fourth embodiment, which is another embodiment of the present disclosure. FIG. 7 is a diagram corresponding to the area inside the circle illustrated by the broken line in FIG. 4. With reference to FIG. 7, the inner peripheral connection portion 53 of the base plate 12 includes three curves 71, 72, and 73 and two straight lines 74 and 75. In other words, in the plan view as viewed in the thickness direction of the base plate 12, the inner periphery of the corner portion of the groove portion 41 have curves 71, 72, and 73 and two straight lines 74 and 75. It should be noted that although FIG. 7 illustrates one of the four corner portions of the groove portion 41, the other corner portions may have a similar configuration. The curve 71 is connected to the first inner peripheral area 51 and the straight line 74. The curve 72 is connected to the second inner peripheral area 52 and the straight line 75. The curve 73 is connected to the straight line 74 and 75. The curve 73 has a convex shape toward the outside. The respective ends of the straight line 74 are connected to the curves 71 and 73. The respective ends of the straight line 75 are connected to the curves 72 and 73. In the semiconductor device according to the fourth embodiment, the possibility that the distance between the inner peripheral connection portion 53 and the outer periphery of the metal plate 13 is shortened can be reduced particularly at the outer peripheral area of the inner peripheral connection portion 53 illustrated by the broken line in FIG. 7. In this manner, while suppressing interface separation between the bonding material 14 and the sealing material 21 and an occurrence of a crack of the sealing material 21, it is also possible to obtain the semiconductor device 11 that is highly reliable.

Fifth Embodiment

Figure 8:
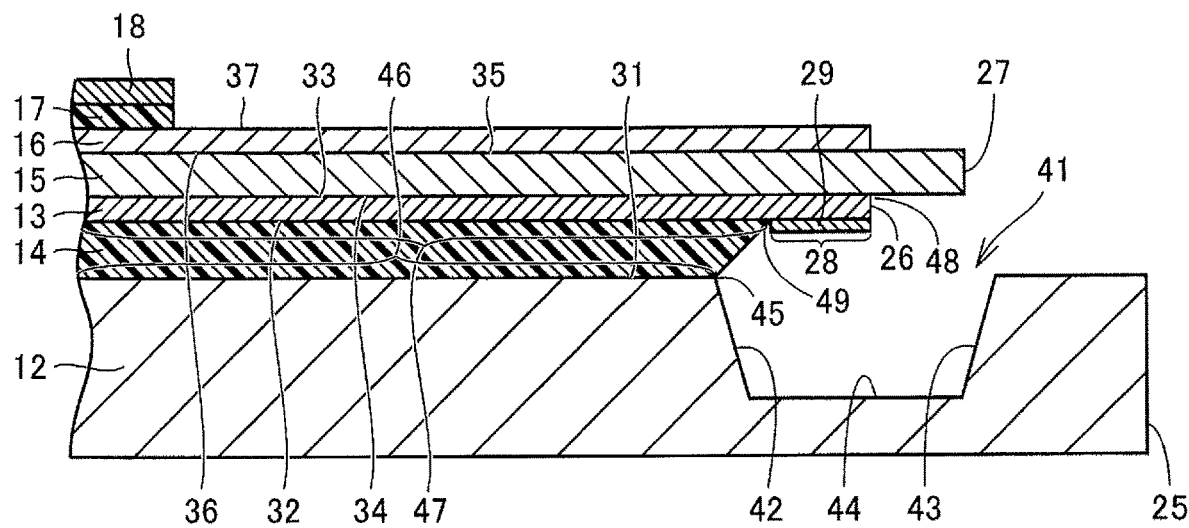
FIG. 8 is a cross-sectional view illustrating a part of a semiconductor device according to another embodiment of the present disclosure.
Figure 9:
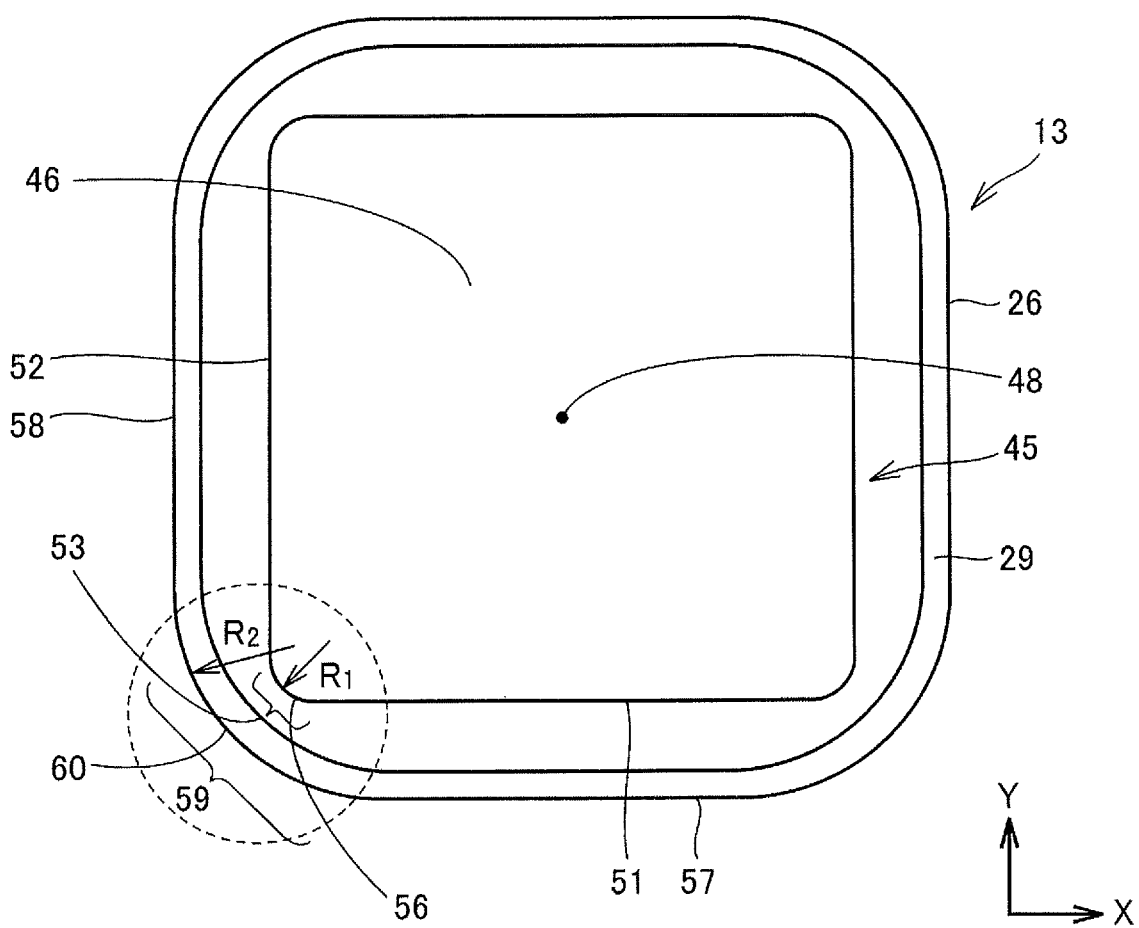
FIG. 9 is a diagram illustrating a plan view of a part of members constituting the semiconductor device illustrated in FIG. 8 as viewed in the thickness direction of a base plate.

FIG. 8 is a cross-sectional view illustrating a part of a semiconductor device 11 according to a fifth embodiment that is another embodiment of the present disclosure. FIG. 9 is a diagram illustrating a plan view of a part of members constituting the semiconductor device illustrated in FIG. 8 as viewed in the thickness direction of the base plate.

With reference to FIG. 8 and FIG. 9, the inner peripheral connection portion 53 is composed of a first curve 56 having an arc shape that is a convex shape toward the outside. The outer peripheral connection portion 59 is composed of a second curve 60 having an arc shape that is a convex shape toward the outside. The radius R1 of curvature of the first curve 56 is smaller than the radius R2 of curvature of the second curve 60.

On the exposed area 28 of the metal plate 13, a coating layer 29 having a lower wettability than that of the metal plate 13 is formed. The coating layer 29 is illustrated thickly in FIG. 8 for ease of understanding. The coating layer 29 can be a chromium plating layer, for example, in a case in which solder is used as the bonding material 14. According to such a configuration, it is possible to prevent the bonding material 14 from wetting and spreading toward the exposed area 28 even when the radius R1 of curvature of the first curve 56 is smaller than the radius R2 of curvature of the second curve 60. It should be noted that in a case in which the coating layer 29 is provided on a portion of the exposed area 28 from the bonding material 14, it is preferable that the coating layer 29 is provided as far as possible toward the center, i.e., far from the outer periphery 26.

It should be noted that although the groove portion 41 is shaped such that the width increases in accordance with proximity to the opening in the cross section as illustrated in FIG. 2 or the like in the embodiment described above, the groove portion 41 is not limited to this and the inner wall surface 42 and the outer wall surface 43 may each extend in the thickness direction. Also, the inner wall surface 42 and the outer wall surface 43 may be configured to have different angles of inclination.

Although the metal plate 13 is substantially rectangular in shape in the embodiments described above, the shape is not limited to this and the metal plate 13 may be polygonal in shape and may include at least one corner portion.

The embodiments disclosed herein are illustrative in all respects, and are not intended to be restrictive in any way. The scope of the present invention is not defined by the above but is indicated by the claims, and is intended to include all modifications within the meaning and range equivalent to the scope of the claims.

DESCRIPTION OF THE REFERENCE NUMERALS 11 semiconductor device
12 base plate
13 metal plate
14, 17 bonding material
15 insulating plate
16 circuit member
18, 19 semiconductor element
21 sealing material
22, 23 terminal
24 outer frame
25, 26, 27 outer periphery
28 exposed area
29 coating layer
31, 32, 33, 34, 35, 36, 37, 62 surface
38, 39 bonding wire
41 groove portion
42 inner wall surface
43 outer wall surface
44 bottom wall surface
45 inner periphery
46 first contact area
47 second contact area
48 center
51 first inner peripheral area
52 second inner peripheral area
53 inner peripheral, connection portion
54 first extension line
55 second extension line
56 first curve
57 first outer peripheral area
58 second outer peripheral area
59 outer peripheral connection portion
60 second curve
61, 62, 63, 66, 67, 71, 72, 73 curve
68, 74, 75 straight line

The invention claimed is:

1. A semiconductor device comprising:
    a base plate having a first surface and having a first contact area in the first surface;
    a metal plate having a second surface, disposed such that the second surface faces the first surface, and having a second contact area in the second surface;
    a bonding material disposed between the first surface and the second surface and in contact with the first contact area and the second contact area to bond the metal plate and the base plate;
    an insulating plate disposed on the metal plate;
    a circuit member disposed on the insulating plate;
    a semiconductor element mounted to the circuit member; and
    a sealing material that covers the metal plate, the bonding material, the insulating plate, the circuit member, and the semiconductor element to seal a space above the base plate,
    wherein outside the second contact area, the second surface has a non-contact area that is not in contact with the bonding material,
    wherein on the base plate, a groove portion facing the non-contact area and surrounding the first contact area is provided,
    wherein, in a plan view as viewed in a thickness direction of the base plate, an inner periphery of a corner portion of the groove portion has a first curve,
    wherein, in the plan view as viewed in the thickness direction of the base plate, an outer periphery of a corner portion of the metal plate has a second curve,
    wherein the first curve has an arc shape that is a convex shape toward outside,
    wherein the second curve has an arc that is a convex shape toward outside, and
    wherein a radius of curvature of the first curve is greater than a radius of curvature of the second curve.

2. The semiconductor device according to claim 1, wherein, in the plan view as viewed in the thickness direction of the base plate, the inner periphery of the groove portion has a first straight line that is connected to one end of the corner portion and a second straight line that is connected to the other end of the corner portion, and
    wherein, in the plan view as viewed in the thickness direction of the base plate, the corner portion is located inside an area that is defined by extending the first straight line and the second straight line.

3. The semiconductor device according to claim 1, wherein, in the plan view as viewed in the thickness direction of the base plate, the non-contact area includes an outer peripheral area of the corner portion.

4. The semiconductor device according to claim 1, wherein, in the plan view as viewed in the thickness direction of the base plate, the inner periphery of the groove portion is defined by two first opposite sides, two second opposite sides, and four corner portions that are connected to the first two opposite sides and the second two opposite sides, and wherein, in the plan view as viewed in the thickness direction of the base plate, the four corner portions are located inside a rectangle that is defined by extending the first two opposite sides and the second two opposite sides.

5. A semiconductor device comprising:

a base plate having a first surface and having a first contact area in the first surface;

a metal plate having a second surface, disposed such that the second surface faces the first surface, and having a second contact area in the second surface;

a bonding material disposed between the first surface and the second surface and in contact with the first contact area and the second contact area to bond the metal plate and the base plate;

an insulating plate disposed on the metal plate;

a circuit member disposed on the insulating plate;

a semiconductor element mounted to the circuit member; and a sealing material that covers the metal plate, the bonding material, the insulating plate, the circuit member, and the semiconductor element to seal a space above the base plate, wherein outside the second contact area, the second surface has a non-contact area that is not in contact with the bonding material, wherein on the base plate, a groove portion facing the non-contact area and surrounding the first contact area is provided, and wherein, in a plan view as viewed in a thickness direction of the base plate, an inner periphery of a corner portion of the groove portion has a first curve, the semiconductor device further comprising:

a coating layer, having a lower wettability than that of the metal plate, formed on the non-contact area, wherein the metal plate is rectangular with rounded corners in the plan view, and wherein in the plan view, the coating layer is situated along an outer perimeter of the metal plate that is rectangular with the rounded corners, the coating layer covering an area within a constant distance from the outer perimeter of the metal plate.

* * * * *